United States Patent
Chang et al.

(10) Patent No.: US 10,026,757 B1
(45) Date of Patent: Jul. 17, 2018

(54) MICRO-LIGHT EMITTING DISPLAY DEVICE

(71) Applicant: MIKRO MESA TECHNOLOGY CO., LTD., Apia (WS)

(72) Inventors: Chun-Yi Chang, Tainan (TW); Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 23 days.

(21) Appl. No.: 15/456,569

(22) Filed: Mar. 12, 2017

(51) Int. Cl.
*H01L 27/12* (2006.01)
*H01L 33/46* (2010.01)

(52) U.S. Cl.
CPC ........ *H01L 27/124* (2013.01); *H01L 27/1218* (2013.01); *H01L 27/1248* (2013.01); *H01L 33/46* (2013.01)

(58) Field of Classification Search
CPC .............. H01L 27/124; H01L 27/1218; H01L 27/1248
See application file for complete search history.

(56) References Cited

U.S. PATENT DOCUMENTS

| 9,680,050 B2 | 6/2017 | Choi et al. | |
| 9,698,134 B2 * | 7/2017 | Li | H01L 24/00 |
| 2005/0093008 A1 | 5/2005 | Suehiro et al. | |
| 2006/0108593 A1 * | 5/2006 | Kim | H01L 33/46 |
| | | | 257/94 |
| 2012/0050694 A1 * | 3/2012 | Huang | G03B 21/2033 |
| | | | 353/38 |
| 2014/0027709 A1 | 1/2014 | Higginson et al. | |
| 2015/0115293 A1 * | 4/2015 | Wu | H01L 27/156 |
| | | | 257/88 |
| 2015/0349205 A1 * | 12/2015 | Chen | H01L 33/38 |
| | | | 257/99 |
| 2016/0343993 A1 * | 11/2016 | Zou | B32B 17/064 |
| 2017/0025399 A1 * | 1/2017 | Takeya | H01L 33/62 |

* cited by examiner

*Primary Examiner* — Christina Sylvia
(74) *Attorney, Agent, or Firm* — CKC & Partners Co., Ltd.

(57) ABSTRACT

A display device includes an array substrate, the bottom conductive lines, the micro light emitting devices, the conductive layers, the upper conductive lines, and a filling material. The bottom conductive lines are present on the array substrate. The conductive layers are respectively present between the micro light emitting devices and the bottom conductive lines. The upper conductive lines cross the bottom conductive lines at the micro light emitting devices. Each of the micro light emitting devices is present between at least one of the bottom conductive lines and at least one of the upper conductive lines. The filling material is present on the array substrate and has at least four openings to respectively expose the micro light emitting devices. The upper conductive lines are electrically connected to the micro light emitting devices respectively through the openings.

20 Claims, 11 Drawing Sheets

US 10,026,757 B1

MICRO-LIGHT EMITTING DISPLAY DEVICE

BACKGROUND

Field of Invention

The present disclosure relates to display devices and methods for manufacturing the display devices.

Description of Related Art

In the recent years, light emitting diodes (LEDs) have become popular in general and commercial lighting applications. As light sources, LEDs have many advantages including low energy consumption, long lifetime, small size, and fast switching, and hence conventional lighting, such as incandescent lighting, is gradually replaced by LED lights.

SUMMARY

One of the embodiments in the disclosure provides a display device includes an array substrate, at least two bottom conductive lines, at least four micro light emitting devices, at least four conductive layers, at least two upper conductive lines, and at least one filling material. The bottom conductive lines are present on the array substrate. The conductive layers are respectively present between the micro light emitting devices and the bottom conductive lines. The upper conductive lines cross the bottom conductive lines at the micro light emitting devices. Each of the micro light emitting devices is present between at least one of the bottom conductive lines and at least one of the upper conductive lines. The filling material is present on the array substrate and has at least four openings to respectively expose the micro light emitting devices. The upper conductive lines are electrically connected to the micro light emitting devices respectively through the openings, and the openings of the filling material are respectively substantially aligned with the conductive layers.

One of the embodiments in the disclosure provides a method for manufacturing a display device includes forming at least two bottom conductive lines on an array substrate. Disposing a least four micro light emitting devices respectively on the bottom conductive lines. Forming at least one filling material covering the micro light emitting devices. Forming at least four openings in the filling material by photolithography, such that the micro light emitting devices are respectively exposed by the openings. Forming at least two upper conductive lines on the filling material. The upper conductive lines are electrically connected to the micro light emitting devices through the openings, and the upper conductive lines and the bottom conductive lines cross at the micro light emitting devices.

According to the above-described structural arrangement, the display device of the present disclosure includes an array substrate, at least two bottom conductive lines, at least four micro light emitting devices, at least four conductive adhesive layers, at least two upper conductive lines, and at least one filling material. The openings of the filling material are respectively substantially aligned with the conductive adhesive layers. The self-aligned openings are manufacturing and structural feature of present disclosure whereby the conductive adhesive layers of the display device is used as a photo mask for photolithography of the filling material. This technique ensures that the openings will align the corresponding micro light emitting devices above the conductive adhesive layers, thus reducing the cost due to the manufacturing a photo mask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1:
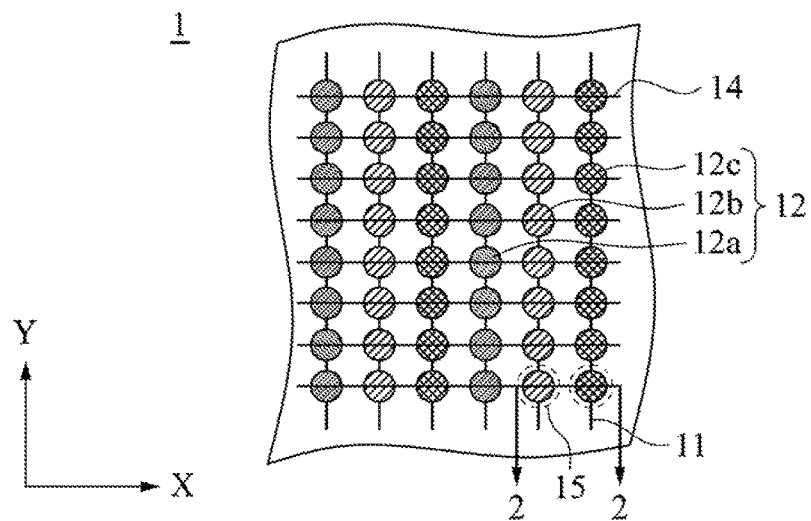
FIG. 1 is a partial schematic top view of a display device in accordance with some embodiments of the present disclosure.
Figure 2:
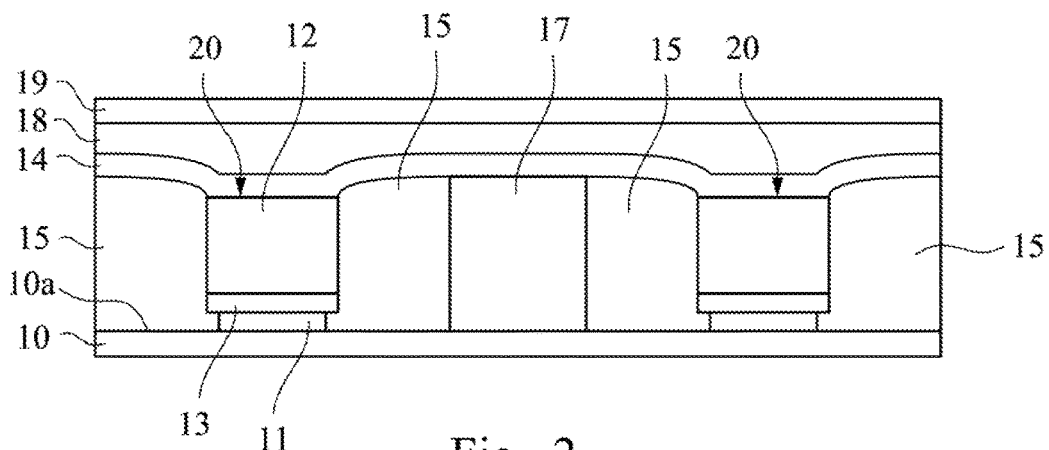
FIG. 2 is a schematic cross-sectional view of a display device taken along line 2-2 of FIG. 1.

Reference is made to FIG. 1 and FIG. 2. FIG. 1 is a partial schematic top view of a display device 1 in accordance with some embodiments of the present disclosure. FIG. 2 is a schematic cross-sectional view taken along line 2 of FIG. 1. As shown in FIG. 1 and FIG. 2, the display device 1 includes an array substrate 10, a plurality of bottom conductive lines 11, a plurality of micro light emitting devices 12, a plurality of conductive adhesive layers 13, a plurality of upper conductive lines 14, and a filling material 15.

The term "micro" light emitting devices as used herein may refer to the descriptive size of certain devices or structures according to embodiments of the disclosure. As used herein, the term "micro" is meant to refer to the scale of about 1 μm to about 100 μm. However, it is to be appreciated that embodiments of the present disclosure are not necessarily so limited, and that certain aspects of the embodiments may be applicable to larger, and possibly smaller size scales.

Referring back to FIG. 1 and FIG. 2, the bottom conductive lines 11 are present on the array substrate 10. In some embodiments, the bottom conductive lines 11 are substantially parallel to each other, and each of the bottom conductive lines 11 extends along a direction Y. In some embodiments, the array substrate 10 is flexible, such that the display device 1 can be flexible and be a portable type. Furthermore, the micro light emitting devices 12 arranged in a column are connected through the same bottom conductive line 11. The bottom conductive lines 11 are made of, for example, a transparent conductive material. The conductive adhesive layers 13 are respectively present between the micro light emitting devices 12 and the bottom conductive lines 11.

In addition, the upper conductive lines 14 cross the bottom conductive lines 11 at the micro light emitting devices 12. In other words, each of the micro light emitting devices 12 is present between the corresponding bottom conductive line 11 and the corresponding upper conductive line 14. In some embodiments, the upper conductive lines 14 are parallel to each other, and each of the upper conductive lines 14 extends along a direction X. In some embodiments, the direction X is substantially perpendicular to the direction Y, but the disclosure is not limited in this regard. Furthermore, the micro light emitting devices 12 arranged in a row are connected through the same upper conductive line 14. The upper conductive lines 14 are made of, for example, a transparent conductive material. In such a configuration, the display device 1 is a passive matrix pixel display.

In some embodiments, the micro light emitting devices 12 include a plurality of red micro light emitting devices 12a, a plurality of green micro light emitting devices 12b, a plurality of blue micro light emitting devices 12c, or combinations thereof, but it should not limit the scope of the present disclosure.

In some embodiments, the micro light emitting devices 12 is a vertical micro light emitting diode (LED).

Figure 3A:
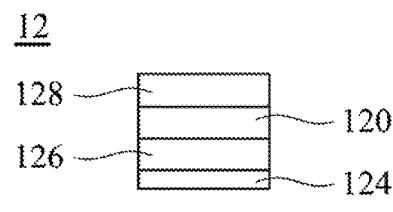
FIGS. 3A and 3B are respectively schematic cross-sectional view of vertical micro light emitting diodes (LEDs) in accordance with some embodiments of the present disclosure.
Figure 3B:
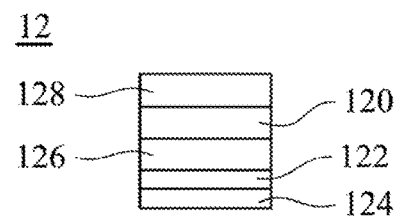
Figure 4A:
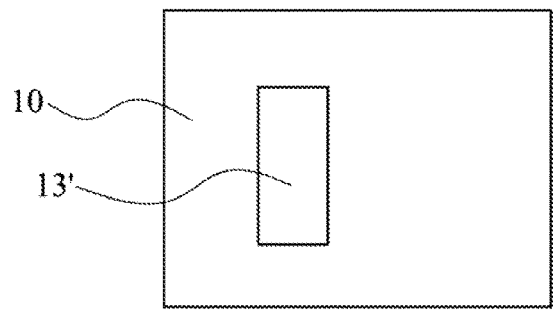
FIGS. 4A-4D are respectively schematic vertical projection view of a conductive adhesive layer, a bonding layer, a reflective layer, and a combination thereof on the array substrate in accordance with some embodiments of the present disclosure.
Figure 4B:
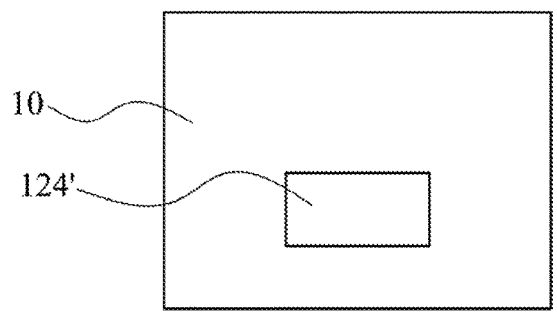
Figure 4C:
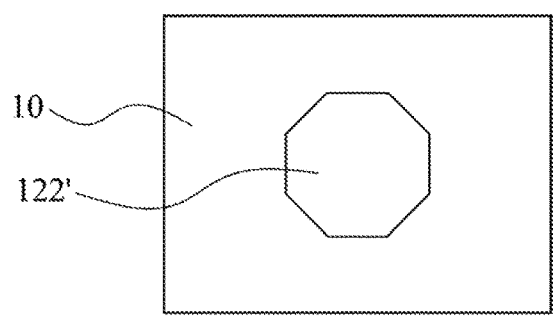
Figure 4D:
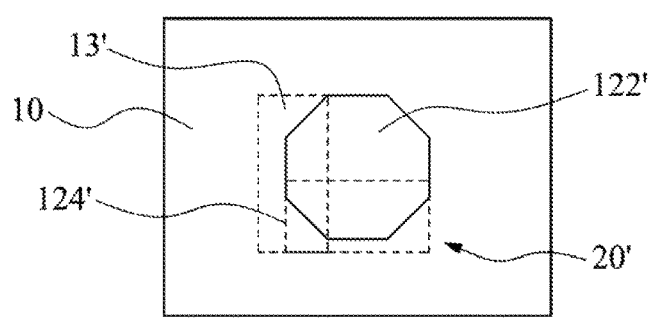

Reference is now made to FIGS. 3A and 3B. FIGS. 3A and 3B are schematic cross-sectional view of vertical micro light emitting diodes 12 in accordance with some embodiments of the present disclosure. In FIG. 3A, the micro light emitting devices 12 includes a first semiconductor layer 126, a second semiconductor layer 128, an active layer 120, and a bonding layer 124 proximal to the corresponding bottom conductive line 11 (shown in FIG. 2), for example, but it should not limit the scope of the present disclosure. Alternatively, in FIG. 3B, in addition to the first and second semiconductor layer 126, 128, the active layer 120, and the bonding layer 124, the micro light emitting devices 12 further includes a reflection layer 122 present between the first semiconductor layer 126 and the bonding layer 124.

Referring back to FIGS. 1-3B, the filling material 15 is present on the array substrate 10 and has a plurality of openings 20 to respectively expose the micro light emitting devices 12 (FIG. 2 only shows two openings 20). In some embodiments, a distance between a surface of the filling material 15 distal to the array substrate 10 and a surface 10a of the array substrate 10 proximal to the filling material 15 is larger than a distance between a surface of each micro light emitting device 12 distal to the array substrate 10 and the surface 10a. In some embodiments, the filling material 15 has a refractive index in a range from about 1.5 to about 2.5, but it should not limit the scope of the present disclosure. The upper conductive lines 14 are electrically connected to the micro light emitting devices 12 respectively through the openings 20. In some embodiments, the openings 20 of the filling material 15 are respectively substantially aligned with the conductive adhesive layers 13.

Alternatively, in some embodiments, the openings 20 of the filling material 15 are respectively substantially aligned with the bonding layer 124 (FIG. 3A) of the micro light emitting devices 12.

Alternatively, in some embodiments, the openings 20 of the filling material 15 are respectively substantially aligned with the reflective layer 122 (FIG. 3B) of the micro light emitting devices 12 in a direction orthogonal to the surface 10a of the array substrate 10 (FIG. 2). Specifically, the profile of the opening 20 is aligned with a non-transparent part of a combination of the conductive adhesive layer 13, the bonding layer 124, and the reflective layer 122. In other words, the combination of the non-transparent part of the conductive adhesive layer 13, the bonding layer 124, and the reflective layer 122 have a vertical projection on the surface 10a of the array substrate 10. The profile of the vertical projection of the combination of the non-transparent part defines a profile of a vertical projection of the opening 20 on the surface 10a, and is substantially the same as the profile of the vertical projection of opening 20.

For example, reference is made to FIGS. 2 and 4A-4D. FIGS. 4A-4D are respectively schematic vertical projection view of a conductive adhesive layer 13, a bonding layer 124, a reflective layer 122, and a combination thereof on the surface 10a of the array substrate 10 in accordance with some embodiments of the present disclosure. In the embodiment, the conductive adhesive layer 13, the bonding layer 124, and the reflective layer 122 are non-transparent. As shown in FIGS. 4A-4D, the conductive adhesive layer 13 has a first vertical projection 13', the bonding layer 124 has a second vertical projection 124', and the reflective layer 122 has a third vertical projection 122' on the surface 10a respectively. The first, second, and third vertical projection 13', 124', and 122' commonly define a profile of a combination vertical projection 20'. A profile of a vertical projection of the corresponding opening 20 on the surface 10a has substantially the same profile as the combination vertical projection 20'. That is, the corresponding opening 20 is substantially aligned with the conductive adhesive layer 13, the bonding layer 124, and the reflective layer 122.

In some embodiment, the third vertical projection 122' of the reflective layer 122 has the largest projection area. Hence, the profile of the combination vertical projection 20' is dominant by the reflective layer 122. A profile of the corresponding opening 20 of the filling material 15 is dominant by the reflective layer 122, and has substantially the same profile as the reflective layer 122. That is, the corresponding opening 20 is substantially aligned with the reflective layer 122, but it should not limit the scope of the present disclosure.

Referring back to FIGS. 1-3B, the display device 1 includes an isolation substance 17. The isolation substance 17 is present within the filling material 15 and divides the filling material 15 into a plurality of separated segments for isolation of the micro light emitting devices 12. Then the openings 20 are respectively present in the separated segments. In some alternative embodiments, the filling material 15 may not have the separated segments, and the isolation substance 17 is omitted.

Furthermore, the display device 1 includes a passivation layer 18. The passivation layer 18 is present on the upper conductive lines 14. In some embodiments, the passivation layer 18 has a refractive index in a range from about 1.5 to about 2.5, but it should not limit the scope of the present disclosure.

The display device 1 further includes a cover substrate 19. The cover substrate 19 is present on the passivation layer 18. In some embodiments, the cover substrate 19 is flexible.

Figure 5:
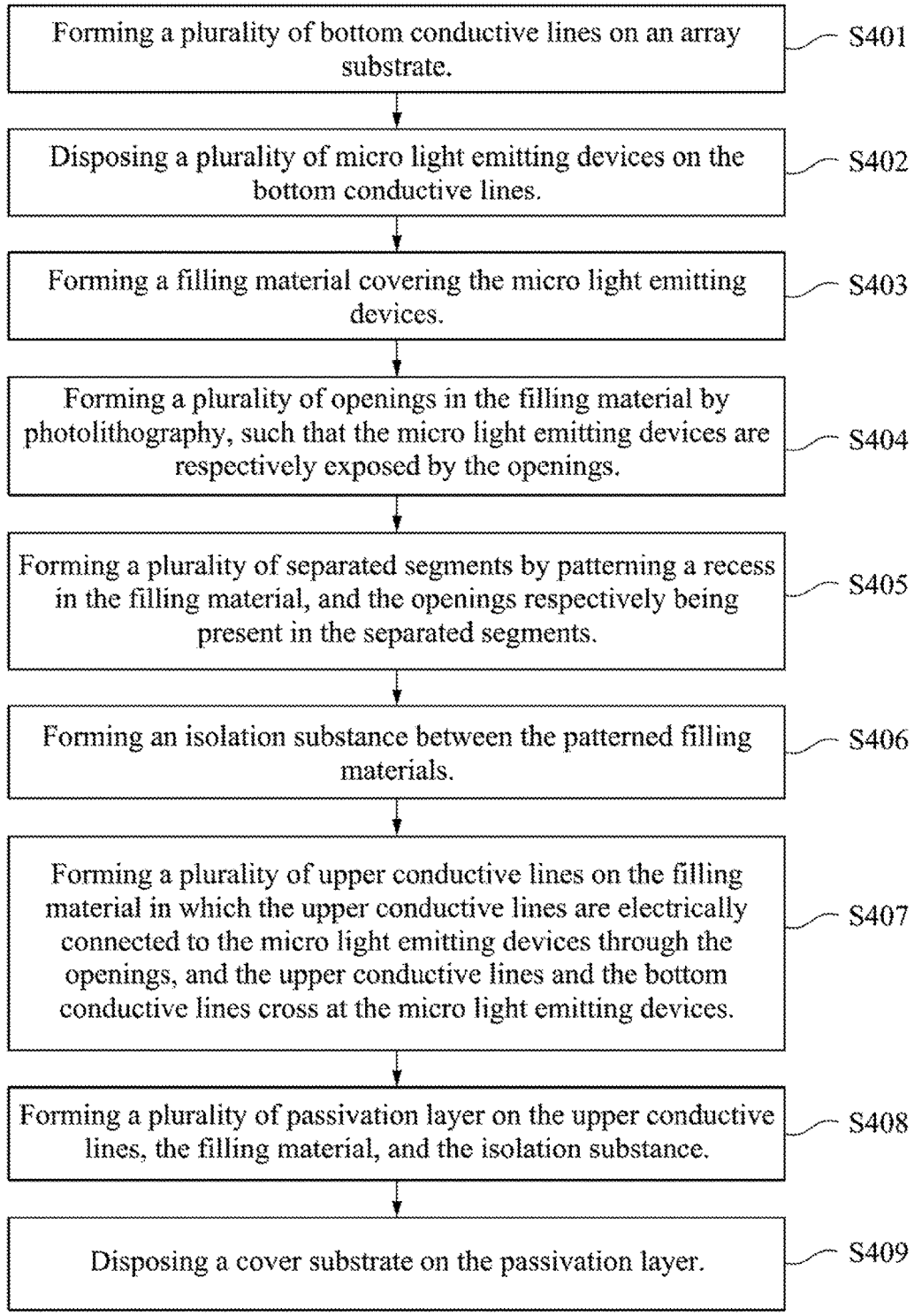
FIG. 5 is a flowchart illustrating a method for manufacturing a display device according to an embodiment of the present disclosure.

Reference is made to FIG. 5 and FIGS. 6A-6J. FIG. 5 illustrates a flowchart of a method for manufacturing the display device 1 according to some embodiments of the present disclosure, in which the method includes steps S401-S409. FIGS. 6A-6J are cross-sectional views of the display device 1 at various stages of fabrication in accordance with some embodiments of the method of FIG. 2. It is understood that FIGS. 6A-6J have been simplified for a better understanding of the embodiments of the present disclosure. Accordingly, additional processes may be provided before, during, and after the stages of fabrication of FIGS. 6A-6J, and some other processes may be briefly described herein.

Figure 6A:
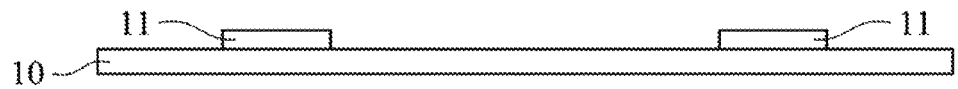
FIGS. 6A-6J are cross-sectional views of a display device at various stages of fabrication in accordance with some embodiments of the method of FIG. 2.

In FIG. 5, the method begins with step S401 in which a plurality of bottom conductive lines 11 are formed on an array substrate 10 (referring to FIG. 6A). In some embodiment, the array substrate 10 is made of a flexible material, such as polyethylene terephthalate (PET), polymethylmethacrylate (PMMA), polycarbonate (PC), or polyimide (PI), and may be transparent.

In some embodiment, the bottom conductive lines 11 are made of a conductive material, and serve as electrode layers, though other layers may be included. The bottom conductive lines 11 can be made of gold, indium, tin, silver, bismuth, lead, gallium, cadmium or any combinations or alloys thereof, and may be transparent, such as transparent conducting oxide (TCO).

Figure 6B:
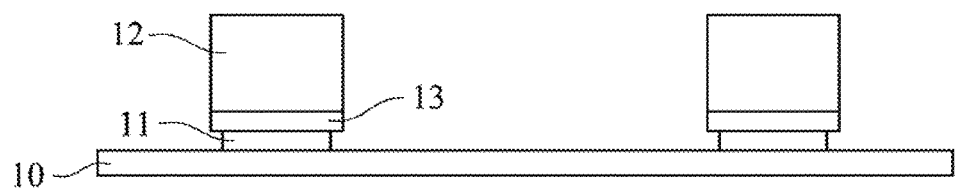

Subsequently, the method continues with step S402 in which a plurality of micro light emitting devices 12 are respectively disposed on the bottom conductive lines 11 (referring to FIG. 6B). In more detail, the micro light emitting devices 12 are respectively disposed on the bottom conductive lines 11 via the conductive adhesive layers 13. In other words, the conductive adhesive layers 13 are respectively disposed on the bottom conductive lines 11 being used for bonding the micro light emitting devices 12 with the bottom conductive lines. Specifically, the micro light emitting devices 12 are poised for pick up with a transfer head (not shown) and then placed on the conductive adhesive layers 13. A variety of suitable transfer heads can be utilized to aid in the pick up and placement operations according to embodiments of the disclosure. For example, the transfer head may exert a pick up pressure on the micro light emitting devices 12 according to vacuum, adhesion, magnetic, or electrostatic attraction in order to pick up the micro light emitting devices 12.

Furthermore, the conductive adhesive layers 13 are electrically coupled with the bottom conductive lines 11 and the micro light emitting devices 12. The conductive adhesive layers 13 are made of a material that is able to thermal cure, or UV cure, such as a solder or a conductive adhesive.

Furthermore, in the configuration of the micro light emitting device 12, the bonding layer 124 (see FIGS. 3A and 3B) is used for bonding the micro light emitting device 12 with the conductive adhesive layers 13. Specifically, in FIG. 3B, the micro light emitting device 12 further includes a reflection layer 122. The reflective layer 122 can reflect the light emitted from the active layer 120, and therefore the micro light emitting device 12 can emit light upwards to enhance the light intensity.

In some embodiments, the bottom conductive lines 11 may be without the conductive adhesive layers 13 thereon, and the micro light emitting devices 12 are directly respectively disposed on the corresponding bottom conductive lines 11.

Figure 6C:
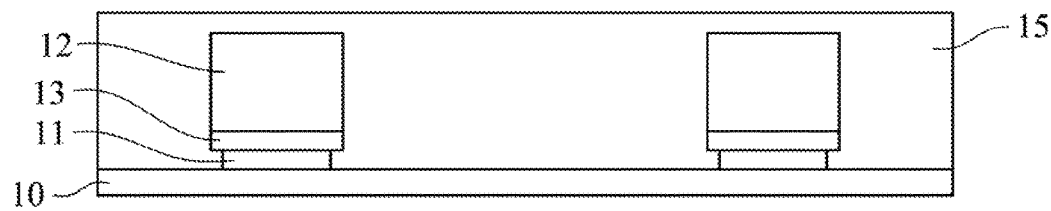

Subsequently, the method continues with step S403 in which a filling material 15 covers the micro light emitting devices 12 (referring to FIG. 6C). Furthermore, the filling material 15 is photoreactive.

Figure 6D:
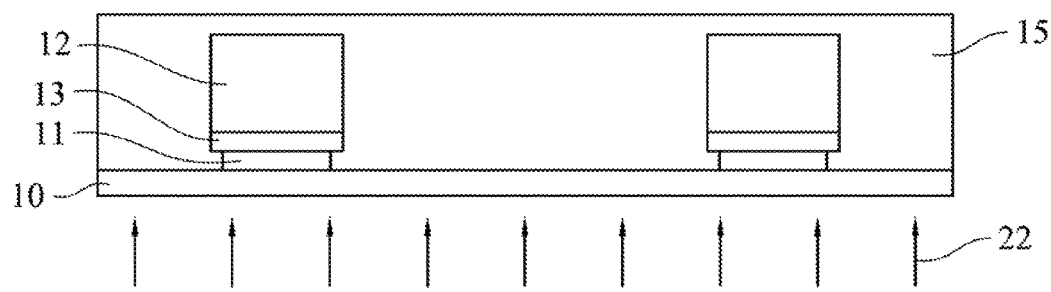
Figure 6E:
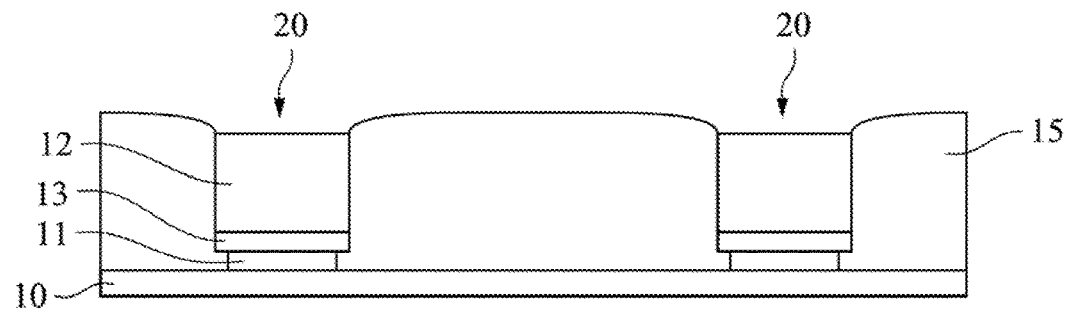

Subsequently, the method continues with step S404 in which a plurality of openings 20 are formed in the filling material 15 by photolithography, such that the micro light emitting devices 12 are respectively exposed by the openings (referring to FIGS. 6D and 6E). In more detail, an electromagnetic wave 22 irradiates to the filling material 15 at least through the array substrate 10 to subsequently pattern the openings 20 in the filling material 15. Therefore, the filling material 15 is patterned by using the conductive adhesive layers 13 as a photo mask in which the conductive adhesive layers 13 are made of a material that is able to reflect the electromagnetic wave 22. An exposure process and a development process are performed to pattern the openings 20 in the filling material 15. Hence, the filling material 15 forms the openings 20 to expose the micro light emitting devices 12.

In this case, the openings 20 of the filling material 15 are respectively substantially aligned with the conductive adhesive layers 13. The self-aligned openings 20 are manufacturing and structural feature of present disclosure whereby the conductive adhesive layers 13 of the display device 1 is used as a photo mask for photolithography of the filling material 15, thus reducing the cost due to the manufacturing a photo mask.

In some embodiments, the conductive adhesive layers 13 can be transparent conductive layers. Alternatively, the conductive adhesive layers 13 can be omitted. Under the circumstances, to pattern the openings 20 in the filling material 15, the filling material 15 can be patterned using the bonding layers 124 as photo masks while an electromagnetic wave 22 irradiates to the filling material 15 through the array substrate 10. In some embodiment, the bonding layer 124 is made of a material that is able to reflect the electromagnetic wave 22. Hence, the openings 20 are formed in the filling material 15 by photolithography, such that the micro light emitting devices 12 are respectively exposed by the openings 20. The openings 20 of the filling material 15 are respectively substantially aligned with the bonding layers 124.

In some embodiments, while the micro light emitting devices 12 shown in FIG. 3B are present on the bottom conductive lines 11, the conductive adhesive layers 13 and the bonding layer 124 both can be transparent conductive layers. Alternatively, one of the conductive adhesive layers 13 and the bonding layer 124 can be omitted, and another of the conductive adhesive layers 13 and the bonding layers 124 can be transparent conductive layers. Under the circumstances, to pattern the openings 20 in the filling material 15, the filling material 15 can be patterned using the reflective layers 122 of the micro light emitting devices 12 as photo masks while an electromagnetic wave irradiates to the filling material 15 at least through the array substrate 10. In some embodiments, the reflective layer 122 is made of a material that is able to reflect the electromagnetic wave 22. Hence, the openings 20 are formed in the filling material 15 by photolithography, such that the micro light emitting devices 12 are respectively exposed by the openings 20. The openings 20 of the filling material 15 are respectively substantially aligned with the reflective layers 122. In some embodiment, the conductive adhesive layer 13, the bonding layer 124, and the reflective layer 122 are non-transparent. Hence, the openings 20 of the filling material 15 are substantially aligned with the combination of the conductive adhesive layer 13, the bonding layer 124, and the reflective layer 122. In other words, referencing to FIGS. 4A-4D, the profile of the corresponding openings 20 is substantially the same as the profile of the combination vertical projection 20' which is combined by the first, second, and third vertical projection 13', 124', and 122' of the conductive adhesive layer 13, the bonding layer 124, and the reflective layer 122.

Figure 6F:
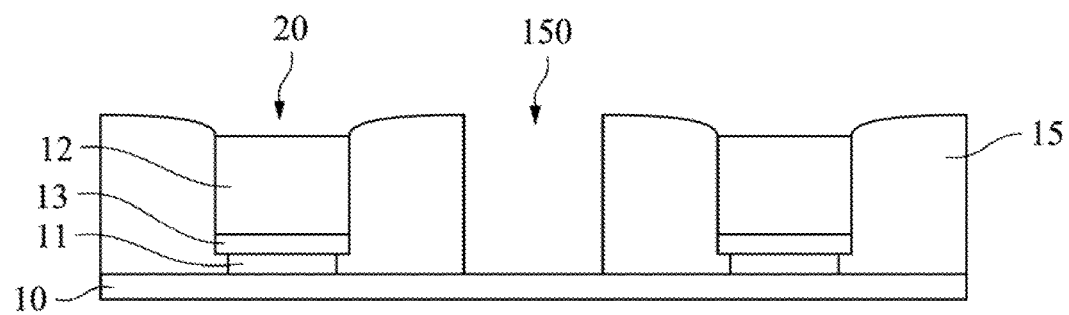

Subsequently, the method continues with step S405 in which a plurality of separated segments are formed by patterning a recess in the filling material 15, and the openings 20 are respectively present in the separated segments (referring to FIG. 6F). An exposure process and a development process are performed to pattern a recess 150 in the filling material 15. Hence, the filling material 15 forms the separated segments, and the openings 20 respectively form in the separated segments.

Figure 6G:
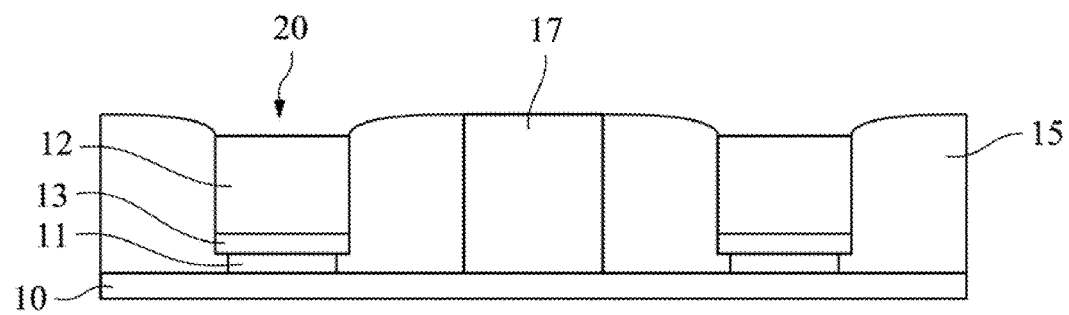

Subsequently, the method continues with step S406 in which an isolation substance 17 is formed between the patterned filling materials 15 (referring to FIG. 6G). In some embodiments, the isolation substance 17 is made of a material, such as a non-transparent resin or air. In some embodiments, the patterned filling material 15 may be without the isolation substance 17 therebetween.

Figure 6H:
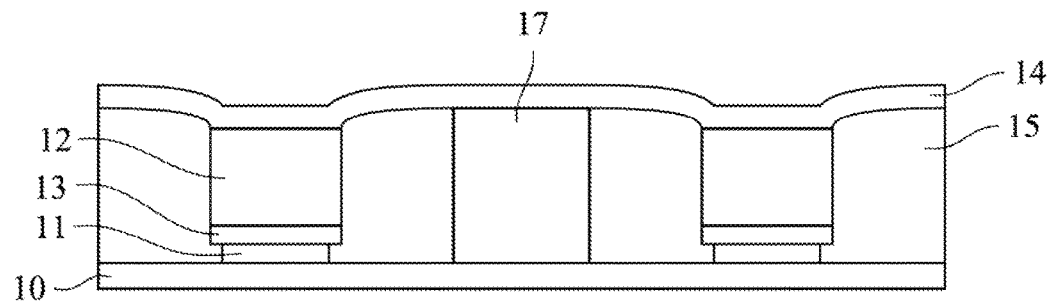

Subsequently, the method continues with step S407 in which a plurality of upper conductive 14 lines are formed on the filling material 15 in which the upper conductive lines 14 are electrically connected to the micro light emitting devices 12 through the openings 20, and the upper conductive lines 14 and the bottom conductive lines 11 cross at the micro light emitting devices 12 (referring to FIG. 6H).

Figure 6I:
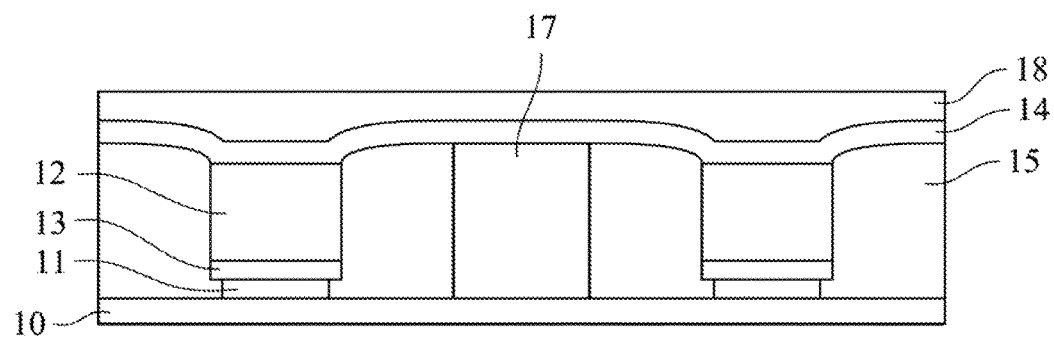

Subsequently, the method continues with step S408 in which a passivation layer 18 is formed on the upper conductive lines 14, the filling material 15, and the isolation substance 17 (referring to corresponding FIG. 6I). In some embodiments, the passivation layer 18 is made of a material, such as curable polymer materials or photoresist. In some embodiments, the upper conductive lines 14 may be without the passivation layer 18 thereon.

Figure 6J:
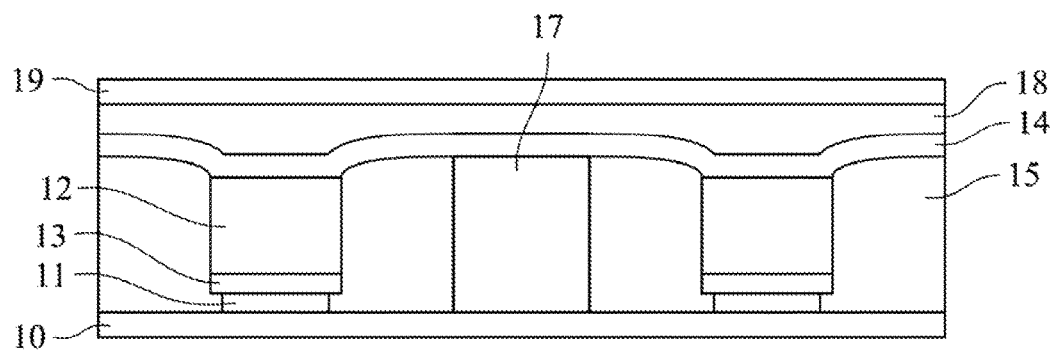

Finally, the method continues with step S409 in which a cover substrate 19 is disposed on the passivation layer 18 (referring to FIG. 6J). The cover substrate 19 is made of a flexible material, such as polyethylene terephthalate (PET), polymethylmethacrylate (PMMA), polycarbonate (PC), polyimide (PI), or composite material.

Figure 7:
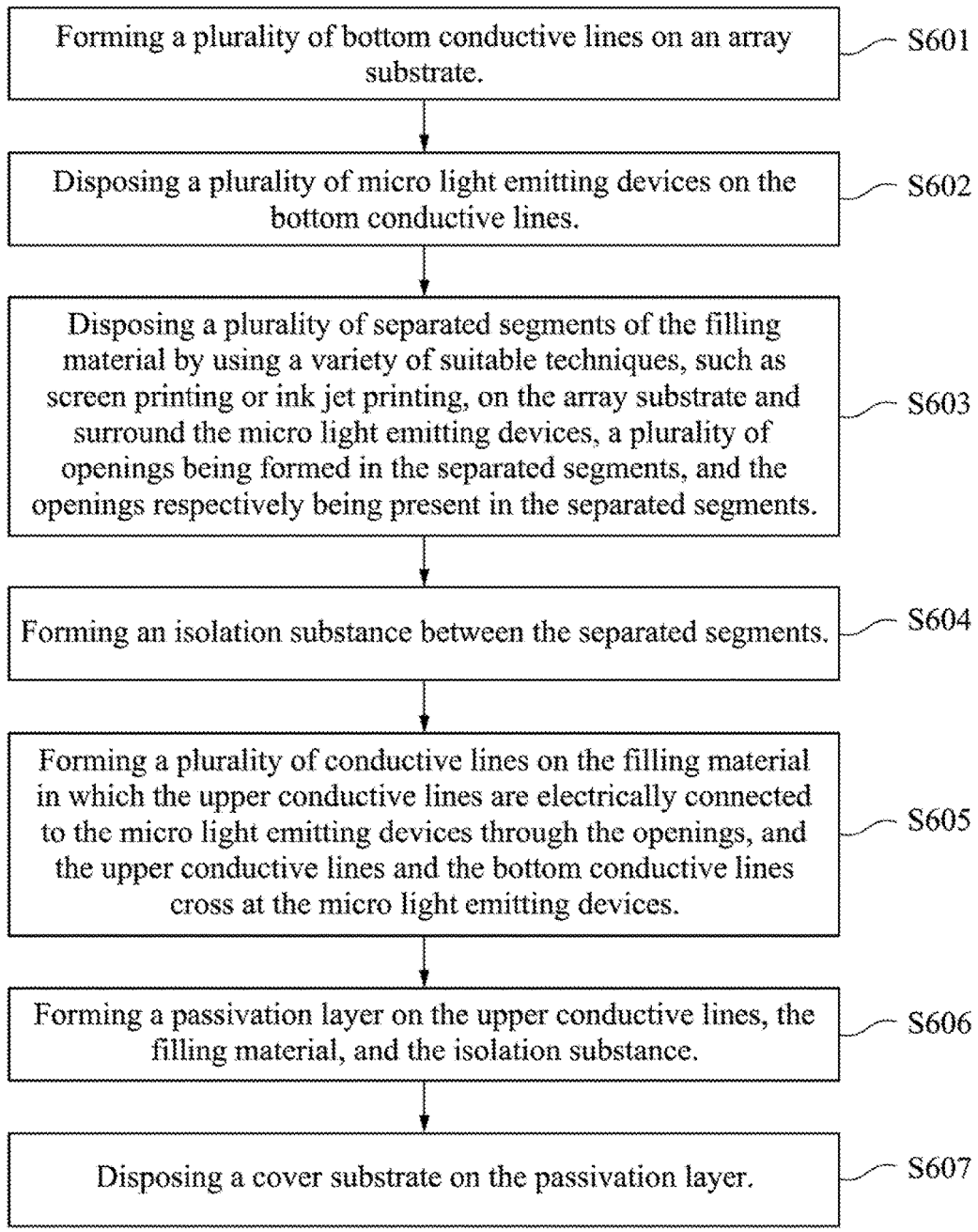
FIG. 7 is a flowchart illustrating a method for manufacturing a display device according to another embodiment of the present disclosure.

Reference is made to FIG. 7 and FIGS. 8A-8G. FIG. 7 is a flowchart illustrating a method for manufacturing a display device 1 according to another embodiment of the present disclosure, in which the method includes S601-S607. FIGS. 8A-8G are cross-sectional views of a display device 1 at various stages of fabrication in accordance with some embodiments of the other method of FIG. 2.

It should be pointed out that steps S601, S602, and S604-S607 of the present embodiment are respectively the same as the steps S401, S402, and S406-S409 of the embodiment of FIG. 5, and the related detailed descriptions may refer to the foregoing paragraphs and are not discussed again herein. The differences between the present embodiment and the embodiment of FIG. 5 are that steps of forming the filling material 15 and the openings 20 are modified.

Figure 8A:
FIGS. 8A-8G are cross-sectional views of a display device at various stages of fabrication in accordance with me embodiments of the other method of FIG. 2.
Figure 8B:
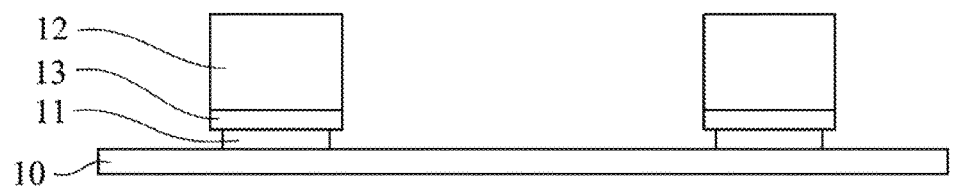
Figure 8C:
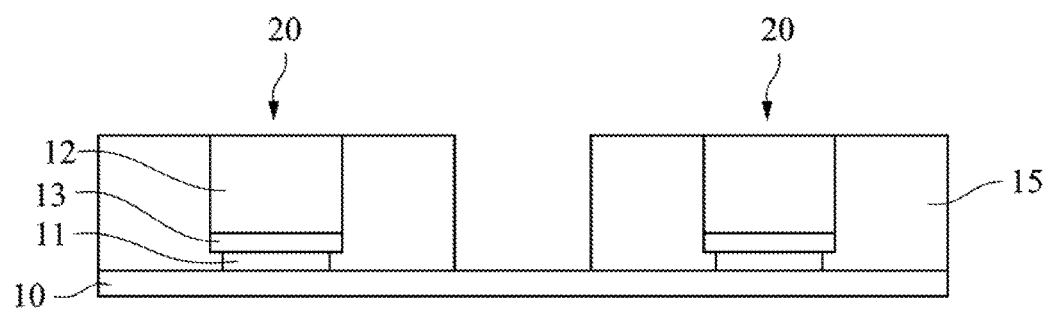
Figure 8D:
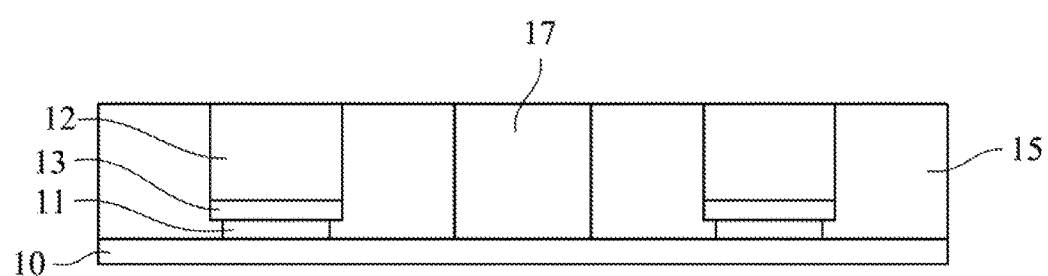
Figure 8E:
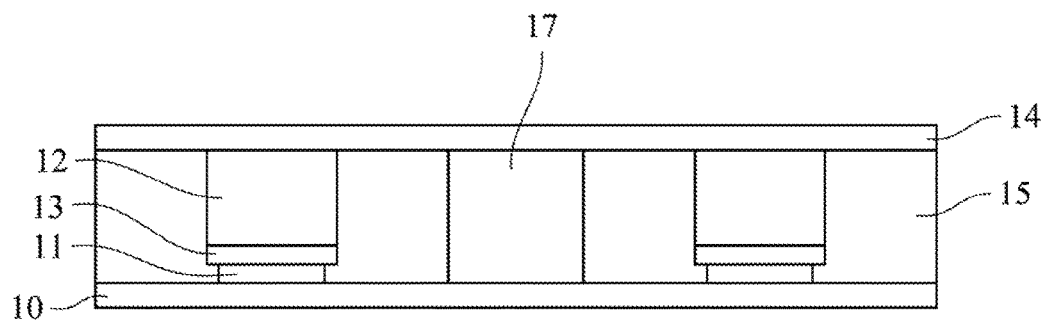
Figure 8F:
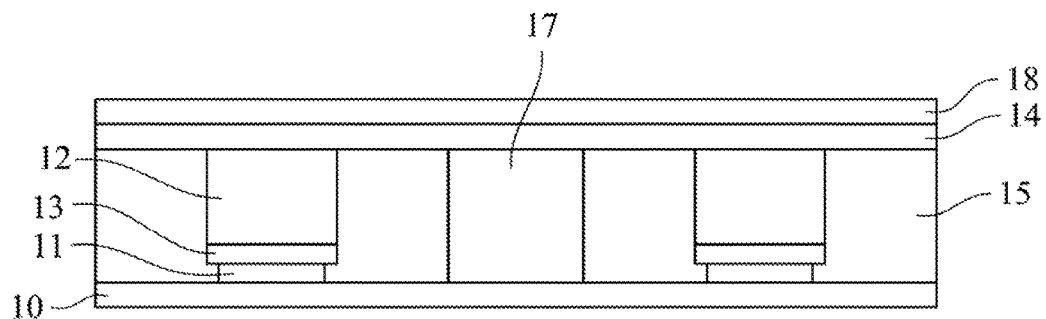
Figure 8G:
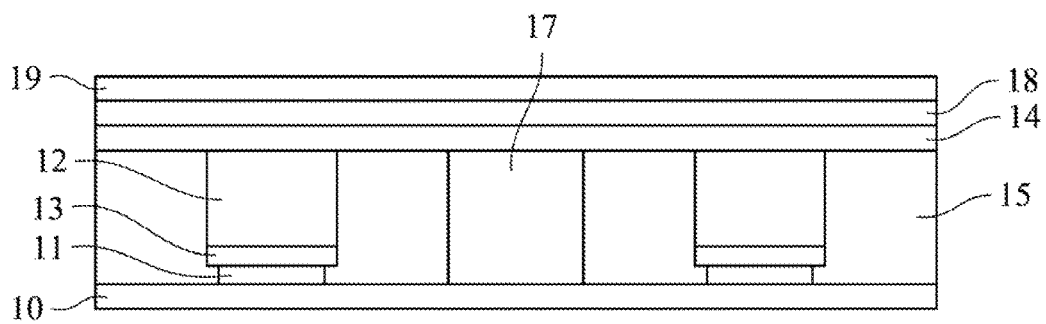

Consequently, in step S603 of FIG. 7, a plurality of separated segments of the filling material 15 are deposited by using a variety of suitable techniques, such as screen printing or ink jet printing, on the array substrate 10 and surround the micro light emitting devices 12, a plurality of openings are formed in the separated segments, and the openings 20 are respectively present in the separated segments (referring to FIG. 8C).

Hence, the forming is carry out in a manner so that the filling material 15 is formed around the micro light emitting devices 12, can be separated segments, and forms openings 20. The micro light emitting devices 12 are respectively exposed by the openings 20.

Figure 9:
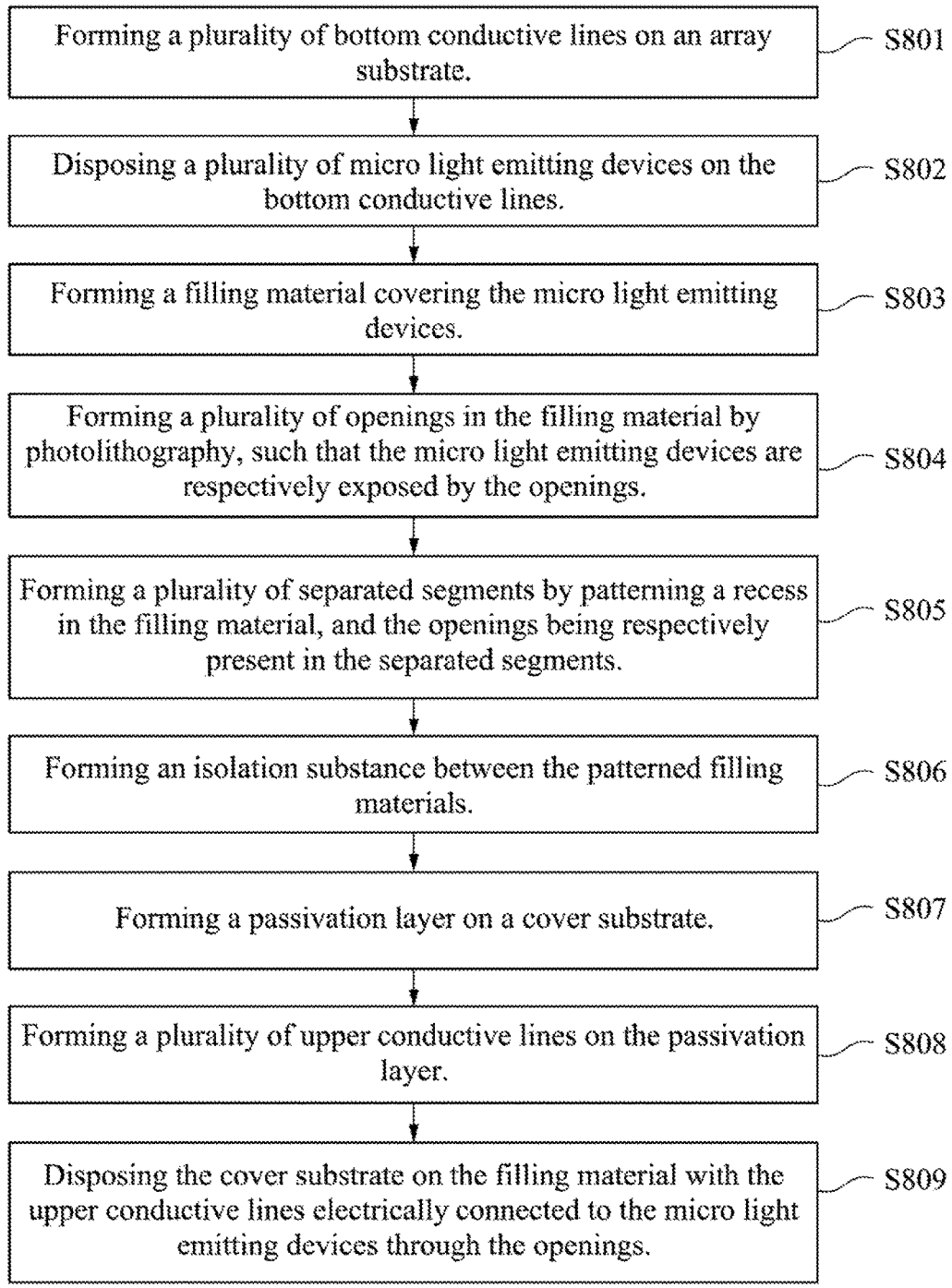
FIG. 9 is a flowchart illustrating a method for manufacturing a display device according to another embodiment of the present disclosure.
Figure 10A:
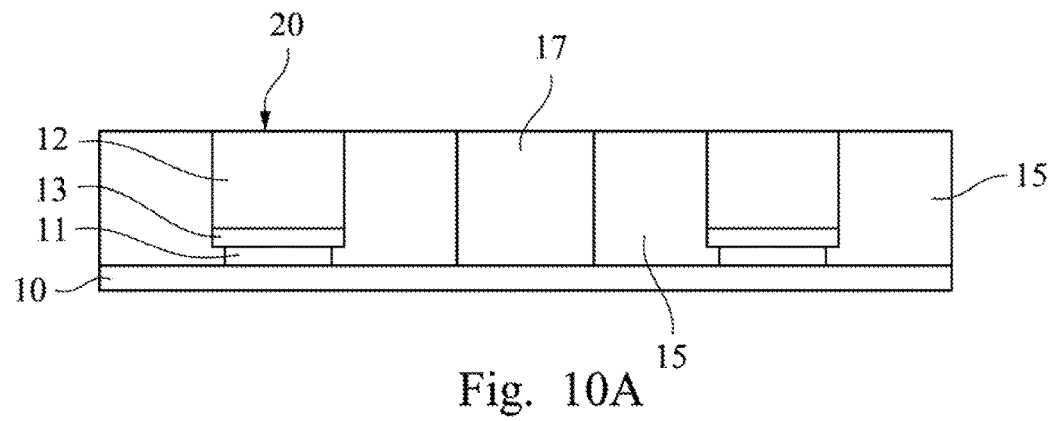
FIGS. 10A-10D are cross-sectional views of a display device at various stages of fabrication in accordance with some embodiments of the other method of FIG. 2.
Figure 10B:
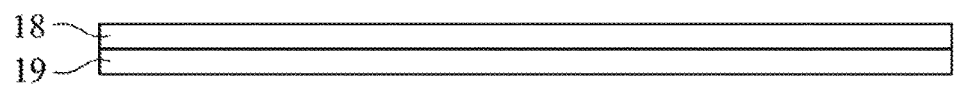
Figure 10C:
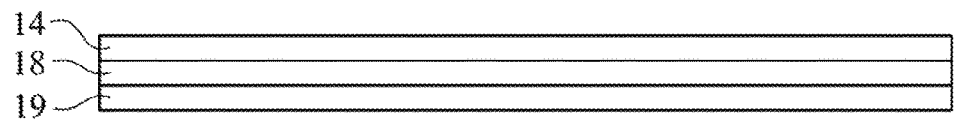
Figure 10D:
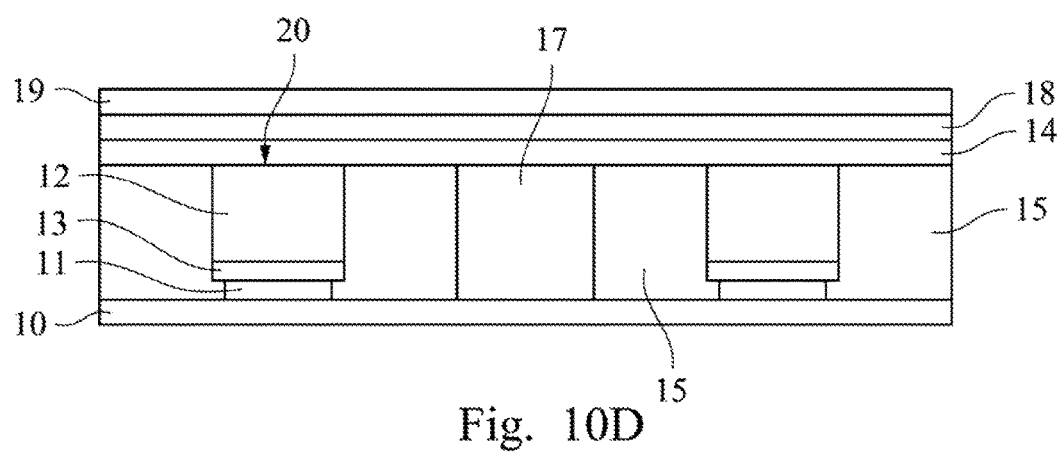

Reference is made to FIG. 9 and FIGS. 10A-10D. FIG. 9 is a flowchart illustrating a method for manufacturing a display device 1 according to another embodiment of the present disclosure. FIGS. 10A-10D are cross-sectional views of a display device 1 at various stages of fabrication in accordance with some embodiments of the other method of FIG. 2.

It should be pointed out that steps S801-S806 of the present embodiment are respectively the same as the steps S401-S406 of the embodiment of FIG. 5, and the related detailed descriptions may refer to the foregoing paragraphs and are not discussed again herein. The differences between the present embodiment and the embodiment of FIG. 5 are that steps of forming the upper conductive line 14, the passivation layer 18, and cover substrate 19 are modified.

Consequently, in steps S807-S809 of FIG. 9, the passivation layer 18 is formed on the cover substrate 19. Then, the upper conductive lines 14 are formed on the passivation layer 18. In some embodiments, the cover substrate 19 may be without the passivation layer 18 thereon. That is, the upper conductive lines 14 are directly formed on the cover substrate 19 (referring to FIGS. 10B-10C).

A combination of the cover substrate 19, the passivation layer 18, and the upper conductive lines 14 is disposed on the filling material 15 with the upper conductive lines 14 electrically connected to the micro light emitting devices 12 through the openings 20. Specifically, the cover substrate 19 is poised for pick up with a transfer head and then placed on the filling material 15 and the micro light emitting devices 12 (referring to FIG. 10D).

According to the foregoing recitations of the embodiments of the disclosure, it can be seen that the display device of the present disclosure includes an array substrate, the bottom conductive lines, the micro light emitting devices, the conductive adhesive layers, the upper conductive lines, and a filling material. The openings of the filling material are respectively substantially aligned with the conductive adhesive layers. The self-aligned openings are manufacturing and structural feature of present disclosure whereby the conductive adhesive layers, the bonding layer, the reflective layer, or a combination thereof of the display device is used as a photo mask for photolithography of the filling material, thus reducing the cost due to the manufacturing a photo mask.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A display device, comprising:
   an array substrate;
   at least two bottom conductive lines present on the array substrate;
   at least four micro light emitting devices;
   at least four conductive layers separated from each other and each present between a corresponding one of the micro light emitting devices and a corresponding one of the bottom conductive lines;
   at least two upper conductive lines crossing the bottom conductive lines at the micro light emitting devices and each of the upper conductive lines crossing the bottom conductive lines, wherein each of the micro light emitting devices is present between at least one of the bottom conductive lines and at least one of the upper conductive lines; and
   at least one filling material present on the array substrate and having at least four openings to respectively expose the micro light emitting devices, wherein the upper conductive lines are electrically connected to the micro light emitting devices respectively through the openings, and the openings of the filling material are respectively substantially aligned with the conductive layers.

2. The display device of claim 1, wherein at least one of the micro light emitting devices has an active layer therein, and at least one of the plurality of conductive layers is a reflective layer present between the active layer and a corresponding one of the bottom conductive lines.

3. The display device of claim 1, further comprising:
   at least one conductive adhesive layer present between at least one of the bottom conductive lines and at least one of the micro light emitting devices, wherein at least one of the conductive layers is a bonding layer present between the conductive adhesive layer and a corresponding one of the micro light emitting devices.

4. The display device of claim 3, wherein at least one of the conductive adhesive layer and said at least one of the conductive layers is non-transparent, and a corresponding one of the openings is aligned with said at least one of the conductive adhesive layer and said at least one of the conductive layers.

5. The display device of claim 3, wherein at least one of the conductive adhesive layer and said at least one of the conductive layers is non-transparent, and a profile of a vertical projection of said at least one of the conductive adhesive layer and the conductive layer on a surface of the array substrate is substantially the same as a profile of a vertical projection of a corresponding one of the openings on the surface of the array substrate.

6. The display device of claim 1, wherein at least one of the micro light emitting devices has a bonding layer proximal to a corresponding one of the bottom conductive lines, wherein at least one of the conductive layers is a conductive adhesive layer present between the bonding layer and a corresponding one of the bottom conductive line.

7. The display device of claim 6, further comprising:
   at least one reflective layer present between said at least one of the micro light emitting devices and the bonding layer, wherein at least one of the bonding layer and the reflective layer is non-transparent, and a profile of a vertical projection of said at least one of the bonding layer and the reflective layer on a surface of the array substrate is substantially the same as a profile of a vertical projection of a corresponding one of the openings on the surface of the array substrate.

8. The display device of claim 1, wherein the array substrate is flexible.

9. The display device of claim 1, wherein at least one of the micro light emitting devices is a vertical micro light emitting diode (LED).

10. The display device of claim 1, wherein at least one of the upper conductive lines is made of a transparent conductive material.

11. The display device of claim 1, wherein the filling material has a refractive index in a range from about 1.5 to about 2.5.

12. The display device of claim 1, wherein the filling material has at least four separated segments, and the openings are respectively present in the separated segments.

13. The display device of claim 12, further comprising:
   at least one isolation substance present between the separated segments.

14. The display device of claim 1, further comprising:
   at least one passivation layer present on the upper conductive lines.

15. The display device of claim 14, further comprising:
   a cover substrate present on the passivation layer, wherein the cover substrate is flexible.

16. The display device of claim 14, wherein the passivation layer has a refractive index in a range from about 1.5 to about 2.5.

17. The display device of claim 1, wherein the micro light emitting devices comprise at least one red micro light emitting device, at least one green micro light emitting device, at least one blue micro light emitting device, or combinations thereof.

18. The display device of claim 1, wherein a distance between a surface of the filling material distal to the array substrate and a surface of the array substrate proximal to the filling material is greater than a distance between a surface of each of the micro light emitting devices distal to the array substrate and said surface of the array substrate.

19. The display device of claim 1, wherein the openings of the filling material are respectively substantially aligned with the conductive layers in a direction orthogonal to a surface of the array substrate.

20. The display device of claim 1, wherein one of the conductive layers is non-transparent, and a profile of a vertical projection of said one of the conductive layers on a surface of the array substrate is substantially the same as a profile of a vertical projection of a corresponding one of the openings on the surface of the array substrate.

* * * * *